United States Patent
Prakash et al.

(10) Patent No.: US 7,911,134 B2
(45) Date of Patent: Mar. 22, 2011

(54) PROCESS FOR FORMING AN ORGANIC LIGHT-EMITTING DIODE AND DEVICES MADE BY THE PROCESS

(75) Inventors: Shiva Prakash, Santa Barabara, CA (US); William F. Feehery, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 260 days.

(21) Appl. No.: 11/758,335

(22) Filed: Jun. 5, 2007

(65) Prior Publication Data

US 2008/0067924 A1 Mar. 20, 2008

Related U.S. Application Data

(60) Provisional application No. 60/811,134, filed on Jun. 5, 2006.

(51) Int. Cl.
*H01J 1/64* (2006.01)
(52) U.S. Cl. .......................................... 313/506; 445/24
(58) Field of Classification Search .................. 313/504, 313/506
See application file for complete search history.

(56) References Cited

U.S. PATENT DOCUMENTS

| | | | |
|---|---|---|---|
| 3,282,875 A | 11/1966 | Connolly et al. | |
| 4,358,545 A | 11/1982 | Ezzell et al. | |
| 4,433,082 A | 2/1984 | Grot | |
| 4,940,525 A | 7/1990 | Ezzell et al. | |
| 5,463,005 A | 10/1995 | Desmarteau | |
| 6,150,426 A | 11/2000 | Curtin et al. | |
| 6,303,238 B1 | 10/2001 | Thompson et al. | |
| 6,670,645 B2 | 12/2003 | Grushin et al. | |
| 7,825,584 B2 * | 11/2010 | Kim | 313/504 |
| 2004/0036421 A1 * | 2/2004 | Arnold et al. | 315/169.3 |
| 2004/0096570 A1 | 5/2004 | Weaver et al. | |
| 2004/0161632 A1 | 8/2004 | Seo et al. | |
| 2004/0164671 A1 | 8/2004 | Noguchi | |
| 2004/0206942 A1 | 10/2004 | Hsu | |
| 2004/0222413 A1 * | 11/2004 | Hsu et al. | 257/40 |
| 2005/0057150 A1 * | 3/2005 | Kim et al. | 313/504 |
| 2007/0046185 A1 * | 3/2007 | Kim | 313/504 |

(Continued)

FOREIGN PATENT DOCUMENTS

EP 1 026 152 B1 7/2006

(Continued)

OTHER PUBLICATIONS

CRC Handbook of Chemistry and Physics, 81$^{st}$ Edition, 2000-2001 (Book Not Included).

(Continued)

*Primary Examiner* — Peter Macchiarolo
(74) *Attorney, Agent, or Firm* — John H. Lamming

(57) ABSTRACT

There is provided a new process for forming a light-emitting diode device having first, second, and third subpixel areas. In the process a hole injection layer is applied over an anode layer. The hole injection material has a conductive polymer and a fluorinated acid polymer. A hole transport layer is applied over the hole injection layer. A first electroluminescent material which is either green or blue, is applied to the first subpixel areas. A second electroluminescent material which is either blue or green, is applied to the second subpixel areas. A red electroluminescent material is applied overall, followed by deposition of a cathode. The second electroluminescent material emits a color different from that of the first electroluminescent material.

15 Claims, 2 Drawing Sheets

U.S. PATENT DOCUMENTS

| | | | |
|---|---|---|---|
| 2008/0020669 A1* | 1/2008 | Feehery et al. | 445/58 |
| 2008/0166566 A1* | 7/2008 | Prakash et al. | 428/421 |
| 2008/0286566 A1* | 11/2008 | Prakash | 428/332 |

FOREIGN PATENT DOCUMENTS

| | | |
|---|---|---|
| WO | WO 98/31716 A1 | 7/1998 |
| WO | WO 99/52954 A1 | 10/1999 |
| WO | WO 00/70655 A2 | 11/2000 |
| WO | WO 01/41512 A1 | 6/2001 |
| WO | WO 03/006537 A1 | 1/2003 |
| WO | WO 03/008424 A1 | 1/2003 |
| WO | WO 03/040257 A1 | 5/2003 |
| WO | WO 03/063555 A1 | 7/2003 |
| WO | WO 03/003394 A1 | 11/2003 |
| WO | WO 03/091688 A2 | 11/2003 |
| WO | WO 2004/016710 A1 | 2/2004 |

OTHER PUBLICATIONS

Lee et al., Poly(thieno[3,4-b]thiophene0. A New Stable Low Band Gap Conducting Polymer, Maromolecules, 2001, vol. 34:5746-5747.

Sotzing et al., Poly(thieno[3,4-b]thiphene): A p- and n-Dopable Polythiophene Exhibiting High Optical Transparency in the Semiconducting State, Maromolecules, 2002, vol. 35:7281-7286.

A. Feiring et al., Aromatic Monomers With Pendant Fluoroalkylsulfonate and Sulfonimide Groups, J. Fluorine Chemistry, 2000, vol. 105:129-135.

A. Feiring et al., Novel Aromatic Polymers With Pendant Lithium Perfluoroalkylsulfonate or Sulfonimide Groups, Macromolecules, 2000, vol. 33:9262-9271.

D.D. Desmarteau, Novel Perfluorinated Ionomers and Ionenes, J. Fluorine Chem., 1995, vol. 72:203-208.

A.J. Appleby et al., Polymeric Perfluoro Bis-Sulfonimides As Possible Fuel Cell Electrolytes, J. Electrochem. Soc., 1993, vol. 140:109-111.

U.S. Appl. No. 60/105,662, filed Oct. 25, 1999, Zhen-Yu Yang et al.

U.S. Appl. No. 60/176,881, filed Jan. 9, 2000, Jose Manuel Rodriquez-Parada.

PCT International Search Report and Written Opinion for International Application No. PCT/US2007/013283 dated Nov. 23, 2007.

Written Opinion of the International Searching Authority, European Patent Office, Rijswijk—Pays Bas, Dec. 5, 2008, PCT/US2007/013283, PCT counterpart of present application.

International Preliminary Report on Patentability, The International Bureau of WIPO, Geneva, CH, Dec. 10, 2008, PCT/US2007/013283, PCT counterpart of the present application.

* cited by examiner

PROCESS FOR FORMING AN ORGANIC LIGHT-EMITTING DIODE AND DEVICES MADE BY THE PROCESS

BACKGROUND INFORMATION

1. Field of the Disclosure

This disclosure relates in general to a process for forming an organic light-emitting diode.

2. Description of the Related Art

Organic electronic devices have attracted increasing attention in recent years. Examples of organic electronic device include Organic Light-Emitting Diodes ("OLEDs"). Current research in the production of full color OLEDs is directed toward the development of cost effective, high throughput processes for producing color pixels. For the manufacture of monochromatic displays, spin-coating processes have been widely adopted. However, manufacture of full color displays usually requires certain modifications to procedures used in manufacture of monochromatic displays. For example, to make a display with full color images, each display pixel is divided into three subpixels, each emitting one of the three primary colors: red, green, and blue.

A representative example of a full color OLED is given in FIG. 1. The electronic device 100 includes one or more layers 120 and 130 to facilitate the injection of holes from the anode layer 110 into the electroluminescent layer 140. An optional electron transport layer 150 is located between the electroluminescent layer 140 and a cathode layer 160. A substrate, not shown, can be present adjacent the anode 110 or the cathode 160. The substrate is frequently present adjacent the anode.

In a full color OLED, the electroluminescent layer 140 is divided into red subpixel areas 141 comprising a red electroluminescent material, green subpixel areas 142 comprising a green electroluminescent material, and blue subpixel areas 143 comprising a blue electroluminescent material. Upon the application of a voltage across the device, red subpixel areas 141 emit red light, green subpixel areas 142 emit green light, and blue subpixel areas 143 emit blue light.

This division of full-color pixels into three subpixels has resulted in a need to modify current processes for depositing different organic polymeric materials onto a single substrate during the manufacture of OLED displays.

SUMMARY

There is provided a process for forming a multicolor organic light-emitting diode having first and second subpixel areas, said process comprising:
applying a hole injection layer over an anode layer, said hole injection layer comprising a conductive polymer and a fluorinated acid polymer;
applying a hole transport layer over the hole injection layer;
applying a first electroluminescent material to the first subpixel areas;
applying a red electroluminescent material overall;
applying a cathode;
wherein the first electroluminescent material is selected from a green electroluminescent material and a blue electroluminescent material.

There is also provided a process for forming a multicolor organic light-emitting diode having first, second and third subpixel areas, said process comprising:
applying a hole injection layer over an anode layer, said hole injection layer comprising a conductive polymer and a fluorinated acid polymer;
applying a hole transport layer over the hole injection layer;
applying a first electroluminescent material to the first subpixel areas;
applying a second electroluminescent material to the second subpixel areas;
applying a red electroluminescent material overall;
applying a cathode;
wherein the first and second electroluminescent materials are selected from the group consisting of green electroluminescent materials and blue electroluminescent materials;
with the proviso that the second electroluminescent material emits a color different from that of the first electroluminescent material.

There is also provided a multicolor organic light-emitting diode device having first and second subpixel areas, said device comprising:
an anode;
a hole injection layer comprising a conductive polymer and a fluorinated acid polymer;
a hole transport layer;
a first electroluminescent layer in the first subpixel areas;
a red electroluminescent layer overall; and
a cathode;
wherein the first electroluminescent comprises a material selected from the group consisting of green electroluminescent materials and blue electroluminescent materials.

There is also provided a multicolor organic light-emitting diode, device having first, second, and third subpixel areas, said device comprising:
an anode;
a hole injection layer comprising a conductive polymer and a fluorinated acid polymer;
a hole transport layer;
a first electroluminescent layer in the first subpixel areas;
a second electroluminescent layer in the second subpixel areas;
a red electroluminescent layer overall; and
a cathode;
wherein the first and second electroluminescent are different and each comprises a material selected from the group consisting of green electroluminescent materials and blue electroluminescent materials.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
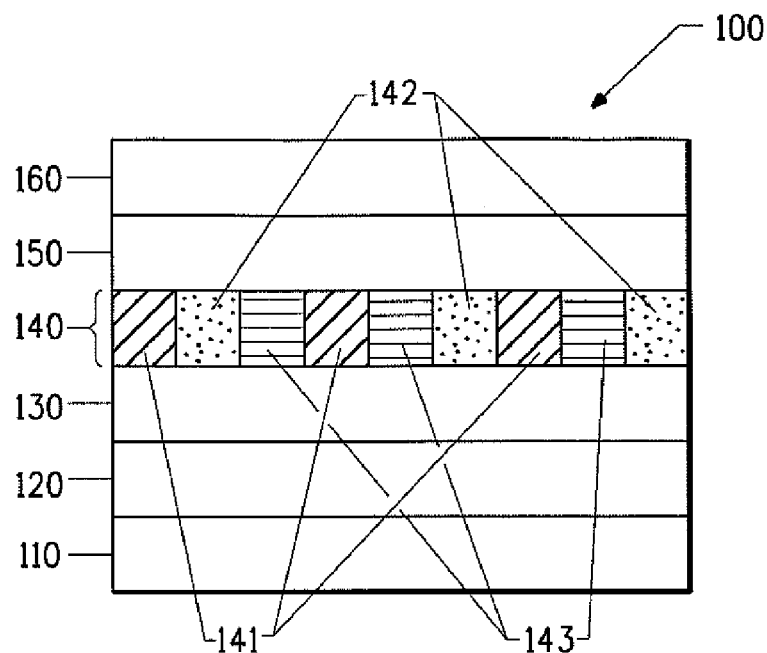
FIG. 1 includes an illustration of a representative full color organic light-emitting diode device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Device, the Hole Injection Layer, the Hole Transport Layer, the Light-Emitting Layer, Other Layers, the Process, and finally Examples.

1. Definitions and Clarification of Terms

Before addressing details of embodiments described below, some terms are defined or clarified.

As used herein the term "conductor" and its variants are intended to refer to a layer material, member, or structure having an electrical property such that current flows through such layer material, member, or structure without a substantial drop in potential. The term is intended to include semiconductors. In one embodiment, a conductor will form a layer having a conductivity of at least $10^{-6}$ S/cm.

The term "electrically conductive material" refers to a material which is inherently or intrinsically capable of electrical conductivity without the addition of carbon black or conductive metal particles.

The term "hole injection" when referring to a layer, material, member, or structure, is intended to mean such layer, material, member, or structure facilitates injection and migration of positive charges through the thickness of such layer, material, member, or structure with relative efficiency and small loss of charge.

"Hole transport" when referring to a layer, material, member, or structure, is intended to mean such layer, material, member, or structure facilitates migration of positive charges through the thickness of such layer, material, member, or structure with relative efficiency and small loss of charge. As used herein, the term "hole transport layer" does not encompass a light-emitting layer, even though that layer may have some hole transport properties.

The term "fluorinated acid polymer" refers to a polymer having acidic groups, where at least some of the hydrogens have been replaced by fluorine. The term "acidic group" refers to a group capable of ionizing to donate a hydrogen ion to a Brønsted base.

The term "surface energy" is the energy required to create a unit area of a surface from a material. A characteristic of surface energy is that liquid materials with a given surface energy will not wet surfaces with a lower surface energy. The term surface energy with respect to liquid materials is intended to have the same meaning as surface tension.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer.

The term "electroluminescent" refers to a material that emits light when activated by an applied voltage (such as in a light emitting diode or chemical cell) or responds to radiant energy and generates a signal with or without an applied bias voltage (such as in a photodetector). When an electroluminescent material is said to emit light of a certain color, it refers to the emission maximum of the material. The term "emission maximum" is intended to mean the highest intensity of radiation emitted. When two or more electroluminescent materials are said to emit light of different colors, the emission maxima are different by at least 50 nm.

The term "red light" is intended to mean radiation that has an emission maximum at a wavelength in a range of approximately 600-700 nm. The term "red light-emitting layer" is intended to mean a layer capable of emitting radiation that has an emission maximum at a wavelength in a range of approximately 600-700 nm.

The term "blue light" is intended to mean radiation that has an emission maximum at a wavelength in a range of approximately 400-500 nm. The term "blue light-emitting layer" is intended to mean a layer capable of emitting radiation that has an emission maximum at a wavelength in a range of approximately 400-500 nm.

The term "green light" is intended to mean radiation that has an emission maximum at a wavelength in a range of approximately 500-600 nm. The term "green light-emitting layer" is intended to mean a layer capable of emitting radiation that has an emission maximum at a wavelength in a range of approximately 500-600 nm.

The term "liquid composition" is intended to mean a liquid composition in which a material is dissolved to form a solution, a liquid medium in which a material is dispersed to form a dispersion, or a liquid medium in which a material is suspended to form a suspension or an emulsion. The term "liquid medium" is intended to mean a liquid material, including a pure liquid, a combination of liquids, a solution, a dispersion, a suspension, and an emulsion. Liquid medium is used regardless whether one or more liquids are present.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited in case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Organic Light-emitting Diode Device ("OLED")

Figure 2:
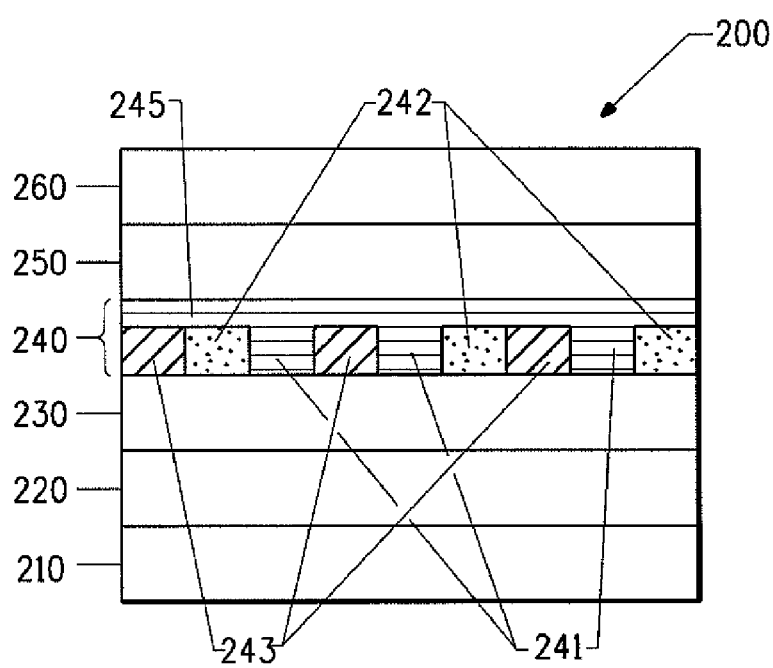
FIG. 2. includes an illustration of a new full color organic light-emitting diode device, as described herein.

A representative example of one embodiment of a new full color OLED as described herein, is given in FIG. 2. The electronic device 200 includes a hole injection layer (also called a "buffer layer") 220 and a hole transport layer 230 to facilitate the injection of holes from the anode layer 210 into the electroluminescent layer 240. An optional electron transport layer 250 is located between the electroluminescent layer 240 and a cathode layer 260. A substrate, not shown, can be present adjacent the anode 210 or the cathode 260. The substrate is frequently present adjacent the anode.

The electroluminescent layer 240 has green subpixel areas 242 comprising a green electroluminescent material, and blue subpixel areas 243 comprising a blue electroluminescent material, as described above for FIG. 1. However, the red electroluminescent material is not only in the red subpixel areas 241, but also over all the subpixel areas 245.

3. Hole Injection Layer

The hole injection layer comprises a conductive polymer and a fluorinated acid polymer.

a. Conductive Polymer

In one embodiment, the electrically conductive material comprises at least one conductive polymer. The term "polymer" is intended to refer to compounds having at least three repeating units and encompasses homopolymers and copolymers. In some embodiments, the electrically conductive polymer is conductive in a protonated form and not conductive in an unprotonated form. Any conductive polymer can be used so long as the hole injection layer has the desired work function.

In one embodiment, the conducting polymer is doped with at least one fluorinated acid polymer. The term "doped" is intended to mean that the electrically conductive polymer has a polymeric counter-ion derived from a polymeric acid to balance the charge on the conductive polymer.

In one embodiment, the conducting polymer is in admixture with the fluorinated acid polymer. In one embodiment, the conductive polymer is doped with at least one non-fluorinated polymeric acid and is in admixture with at least one fluorinated acid polymer.

In one embodiment, the electrically conductive polymer will form a film which has a conductivity of at least $10^{-7}$ S/cm. The monomer from which the conductive polymer is formed, is referred to as a "precursor monomer". A copolymer will have more than one precursor monomer.

In one embodiment, the conductive polymer is made from at least one precursor monomer selected from thiophenes, pyrroles, anilines, and polycyclic aromatics. The polymers made from these monomers are referred to herein as polythiophenes, polyselenophenes, poly(tellurophenes), polypyrroles, polyanilines, and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In one embodiment, the polycyclic aromatic polymers are poly(thienothiophenes).

In one embodiment, thiophene monomers contemplated for use to form the electrically conductive polymer in the composition comprise Formula I below:

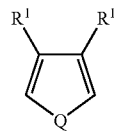

(I)

wherein:
Q is selected from the group consisting of S, Se, and Te;
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, selenium, tellurium, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

| | |
|---|---|
| "alcohol" | $-R^3-OH$ |
| "amido" | $-R^3-C(O)N(R^6)\,R^6$ |
| "amidosulfonate" | $-R^3-C(O)N(R^6)\,R^4-SO_3Z$ |
| "benzyl" | $-CH_2-C_6H_5$ |
| "carboxylate" | $-R^3-C(O)O-Z$ or $-R^3-O-C(O)-Z$ |
| "ether" | $-R^3-(O-R^5)_p-O-R^5$ |
| "ether carboxylate" | $-R^3-O-R^4-C(O)O-Z$ or $-R^3-O-R^4-O-C(O)-Z$ |
| "ether sulfonate" | $-R^3-O-R^4-SO_3Z$ |
| "ester sulfonate" | $-R^3-O-C(O)-R^4-SO_3Z$ |
| "sulfonimide" | $-R^3-SO_2-NH-SO_2-R^5$ |
| "urethane" | $-R^3-O-C(O)-N(R^6)_2$ | where all "R" groups are the same or different at each occurrence and:
$R^3$ is a single bond or an alkylene group
$R^4$ is an alkylene group
$R^5$ is an alkyl group
$R^6$ is hydrogen or an alkyl group
p is 0 or an integer from 1 to 20
Z is H, alkali metal, alkaline earth metal, $N(R^5)_4$ or $R^5$ Any of the above groups may further be unsubstituted or substituted, and any group may have F substituted for one or more hydrogens, including perfluorinated groups. In one embodiment, the alkyl and alkylene groups have from 1-20 carbon atoms.

In one embodiment, in the thiophene monomer, both $R^1$ together form —O—$(CHY)_m$—O—, where m is 2 or 3, and Y is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

In one embodiment, the thiophene monomer has Formula I(a):

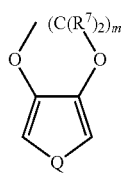

(Ia)

wherein:

Q is selected from the group consisting of S, Se, and Te;

$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and m is 2 or 3.

In one embodiment of Formula I(a), m is two, one $R^7$ is an alkyl group of more than 5 carbon atoms, and all other $R^7$ are hydrogen. In one embodiment of Formula I(a), at least one $R^7$ group is fluorinated. In one embodiment, at least one $R^7$ group has at least one fluorine substituent. In one embodiment, the $R^7$ group is fully fluorinated.

In one embodiment of Formula I(a), the $R^7$ substituents on the fused alicyclic ring on the thiophene offer improved solubility of the monomers in water and facilitate polymerization in the presence of the fluorinated acid polymer.

In one embodiment of Formula I(a), m is 2, one $R^7$ is sulfonic acid-propylene-ether-methylene and all other $R^7$ are hydrogen. In one embodiment, m is 2, one $R^7$ is propyl-ether-ethylene and all other $R^7$ are hydrogen. In one embodiment, m is 2, one $R^7$ is methoxy and all other $R^7$ are hydrogen. In one embodiment, one $R^7$ is sulfonic acid difluoromethylene ester methylene (—$CH_2$—O—C(O)—$CF_2$—$SO_3H$), and all other $R^7$ are hydrogen.

In one embodiment, pyrrole monomers contemplated for use to form the electrically conductive polymer in the composition comprise Formula II below.

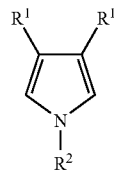

(II)

where in Formula II:

$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the pyrrole monomer is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—(CHY)$_m$—O—, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In one embodiment, at least one Y group is not hydrogen. In one embodiment, at least one Y group is a substituent having F substituted for at least one hydrogen. In one embodiment, at least one Y group is perfluorinated.

In one embodiment, aniline monomers contemplated for use to form the electrically conductive polymer in the composition comprise Formula III below.

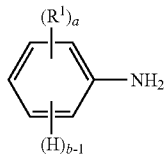
(III)

wherein:

a is 0 or an integer from 1 to 4;

b is an integer from 1 to 5, with the proviso that a+b=5; and $R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula IV(a) or Formula IV(b) shown below, or a combination of both formulae.

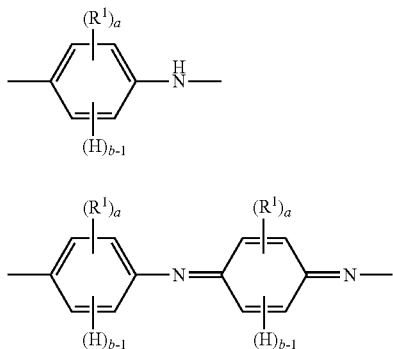

IV(a)

IV(b)

where a, b and $R^1$ are as defined above.

In one embodiment, the aniline monomer is unsubstituted and a=0.

In one embodiment, a is not 0 and at least one $R^1$ is fluorinated. In one embodiment, at least one $R^1$ is perfluorinated.

In one embodiment, fused polycylic heteroaromatic monomers contemplated for use to form the electrically conductive polymer in the composition have two or more fused aromatic rings, at least one of which is heteroaromatic. In one embodiment, the fused polycyclic heteroaromatic monomer has Formula V:

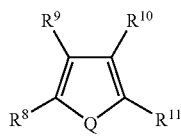
(V)

wherein:

Q is S, Se, Te, or $NR^6$;

$R^6$ is hydrogen or alkyl;

$R^8$, $R^9$, $R^{10}$, and $R^{11}$ are independently selected so as to be the same or different at each occurrence and are selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur, selenium, tellurium, or oxygen atoms.

In one embodiment, the fused polycyclic heteroaromatic monomer has Formula V(a), V(b), V(c), V(d), V(e), V(f), and V(g):

(Va)

(Vb)

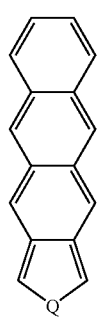
(Vc)

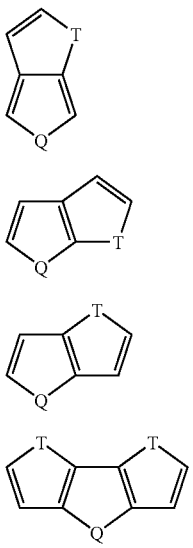

(Vd)

(Ve)

(Vf)

(Vg)

wherein:
Q is S, Se, Te, or NH; and
T is the same or different at each occurrence and is selected from S, $NR^6$, O, $SiR^6_2$, Se, Te, and $PR^6$;
$R^6$ is hydrogen or alkyl.

The fused polycyclic heteroaromatic monomers may be further substituted with groups selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, the fused polycyclic heteroaromatic monomer is a thieno(thiophene). Such compounds have been discussed in, for example, Macromolecules, 34, 5746-5747 (2001); and Macromolecules, 35, 7281-7286 (2002). In one embodiment, the thieno(thiophene) is selected from thieno(2,3-b)thiophene, thieno(3,2-b)thiophene, and thieno(3,4-b)thiophene. In one embodiment, the thieno(thiophene) monomer is further substituted with at least one group selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, polycyclic heteroaromatic monomers contemplated for use to form the polymer in the composition comprise Formula VI:

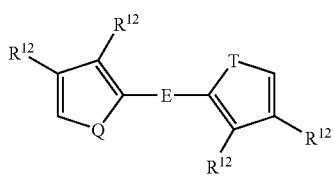

(VI)

wherein:
Q is S, Se, Te, or $NR^6$;
T is selected from S, $NR^6$, O, $SiR^6_2$, Se, Te, and $PR^6$;
E is selected from alkenylene, arylene, and heteroarylene;
$R^6$ is hydrogen or alkyl;

$R^{12}$ is the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms.

In one embodiment, the electrically conductive polymer is a copolymer of a precursor monomer and at least one second monomer. Any type of second monomer can be used, so long as it does not detrimentally affect the desired properties of the copolymer. In one embodiment, the second monomer comprises no more than 50% of the polymer, based on the total number of monomer units. In one embodiment, the second monomer comprises no more than 30%, based on the total number of monomer units. In one embodiment, the second monomer comprises no more than 10%, based on the total number of monomer units.

Exemplary types of second monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be further substituted.

In one embodiment, the copolymers are made by first forming an intermediate precursor monomer having the structure A-B-C, where A and C represent precursor monomers, which can be the same or different, and B represents a second monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In one embodiment, the electrically conductive polymer is a copolymer of two or more precursor monomers. In one embodiment, the precursor monomers are selected from a thiophene, a pyrrole, an aniline, and a polycyclic aromatic.

b. Fluorinated Acid Polymers

The fluorinated acid polymer can be any polymer which is fluorinated and has acidic groups with acidic protons. The term includes partially and fully fluorinated materials. In one embodiment, the fluorinated acid polymer is highly fluorinated. The term "highly fluorinated" means that at least 50% of the available hydrogens bonded to a carbon, have been replaced with fluorine. The acidic groups supply an ionizable proton. In one embodiment, the acidic proton has a pKa of less than 3. In one embodiment, the acidic proton has a pKa of less than 0. In one embodiment, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the fluorinated acid polymer is water-soluble. In one embodiment, the fluorinated acid polymer is dispersible in water.

Figure 3:
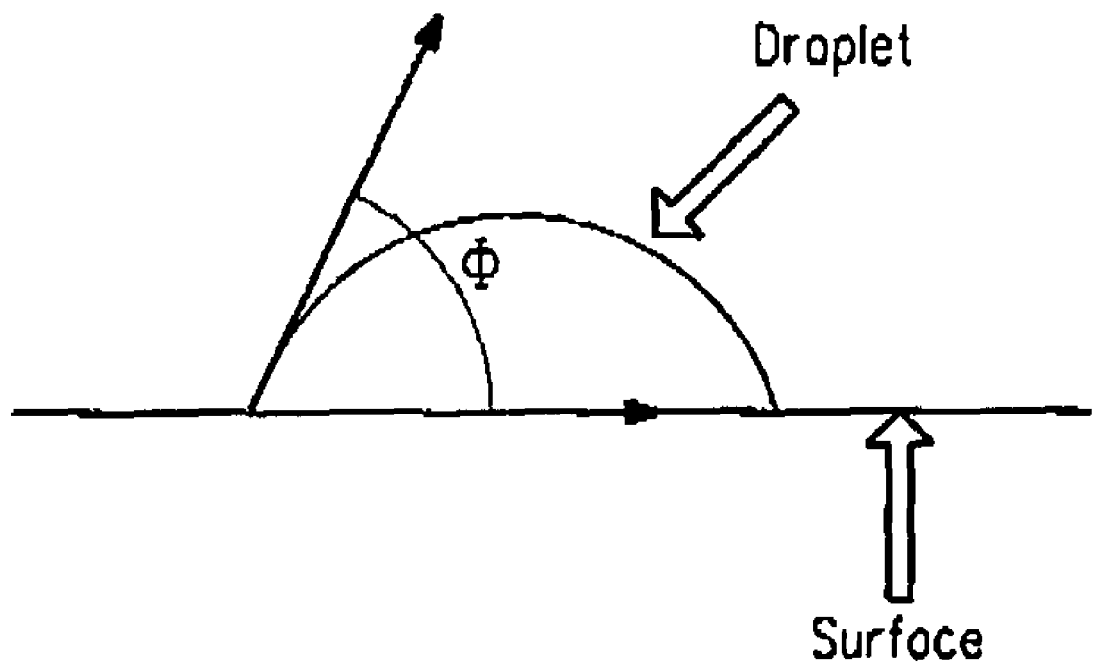
FIG. 3 includes an illustration of contact angle.

In one embodiment, the fluorinated acid polymer is organic solvent wettable. The term "organic solvent wettable" refers to a material which, when formed into a film, is wettable by organic solvents. In one embodiment, wettable materials form films which are wettable by phenylhexane with a contact angle no greater than 40°. As used herein, the term "contact angle" is intended to mean the angle φ shown in FIG. 3. For a droplet of liquid medium, angle φ is defined by the intersection of the plane of the surface and a line from the outer edge of the droplet to the surface. Furthermore, angle φ is measured after the droplet has reached an equilibrium position on the surface after being applied, i.e. "static contact angle". The film of the organic solvent wettable fluorinated polymeric acid is represented as the surface. In one embodiment, the contact angle is no greater than 35°. In one embodiment, the contact angle is no greater than 30°. The methods for measuring contact angles are well known.

In one embodiment, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are sulfonic acid groups or sulfonimide groups. A sulfonimide group has the formula:

—SO$_2$—NH—SO$_2$—R where R is an alkyl group.

In one embodiment, the acidic groups are on a fluorinated side chain. In one embodiment, the fluorinated side chains are selected from alkyl groups, alkoxy groups, amido groups, ether groups, and combinations thereof.

In one embodiment, the fluorinated acid polymer has a fluorinated olefin backbone, with pendant fluorinated ether sulfonate, fluorinated ester sulfonate, or fluorinated ether sulfonimide groups. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the fluorinated acid polymer is homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In one embodiment, the fluorinated acid polymer is a homopolymer or copolymer of monomers having Formula VII:

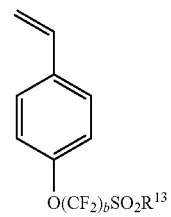

(VII)

where:
b is an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer is "SFS" or "SFSI" shown below:

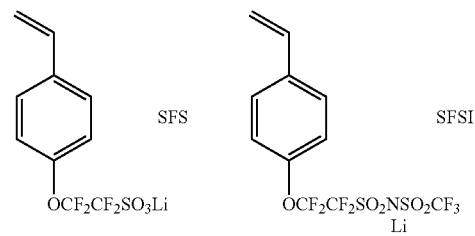

After polymerization, the polymer can be converted to the acid form.

In one embodiment, the fluorinated acid polymer is a homopolymer or copolymer of a trifluorostyrene having acidic groups. In one embodiment, the trifluorostyrene monomer has Formula VIII:

(VIII)

where:
W is selected from $(CF_2)_b$, $O(CF_2)_b$, $S(CF_2)_b$, $(CF_2)_bO(CF_2)_b$,
b is independently an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the fluorinated acid polymer is a sulfonimide polymer having Formula IX:

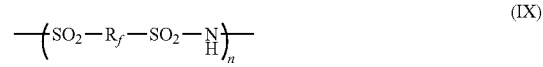

(IX)

where:
$R_f$ is selected from fluorinated alkylene, fluorinated heteroalkylene, fluorinated arylene, and fluorinated heteroarylene; and n is at least 4.

In one embodiment of Formula IX, $R_f$ is a perfluoroalkyl group. In one embodiment, $R_f$ is a perfluorobutyl group. In one embodiment, $R_f$ contains ether oxygens. In one embodiment n is greater than 10.

In one embodiment, the fluorinated acid polymer comprises a fluorinated polymer backbone and a side chain having Formula X:

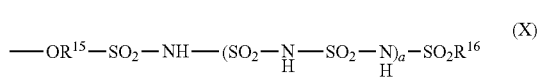
(X)

where:
$R^{15}$ is a fluorinated alkylene group or a fluorinated heteroalkylene group;
$R^{16}$ is a fluorinated alkyl or a fluorinated aryl group; and
a is 0 or an integer from 1 to 4.

In one embodiment, the fluorinated acid polymer has Formula XI:

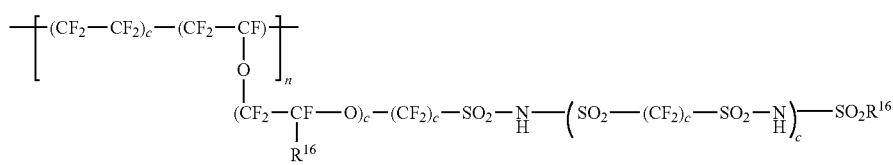
(XI)

where:
$R^{16}$ is a fluorinated alkyl or a fluorinated aryl group;
c is independently 0 or an integer from 1 to 3; and
n is at least 4.

The synthesis of fluorinated acid polymers has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the fluorinated acid polymer comprises at least one repeat unit derived from an ethylenically unsaturated compound having the structure (XII):

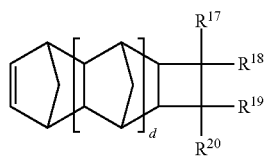
(XII)

wherein n is 0, 1, or 2;
$R^{17}$ to $R^{20}$ are independently H, halogen, alkyl or alkoxy of 1 to 10 carbon atoms, Y, $C(R_f')(R_f')OR^{21}$, $R^4Y$ or $OR^4Y$;
Y is $COE^2$, $SO_2 E^2$, or sulfonimide;
$R^{21}$ is hydrogen or an acid-labile protecting group;
$R_f'$ is the same or different at each occurrence and is a fluoroalkyl group of 1 to 10 carbon atoms, or taken together are $(CF_2)e$ where e is 2 to 10;
$R^4$ is an alkylene group;
$E^2$ is OH, halogen, or $OR^7$; and
$R^7$ is an alkyl group;

with the proviso that at least one of $R^{17}$ to $R^{20}$ is Y, $R^4Y$ or $OR^5Y$. $R^4$, $R^5$, and $R^{17}$ to $R^{20}$ may optionally be substituted by halogen or ether oxygen.

Some illustrative, but nonlimiting, examples of representative monomers of structure (XII) and within the scope of the of the materials described herein are presented below (XII-a through XII-e, left to right):

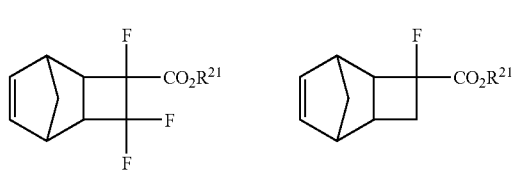

-continued

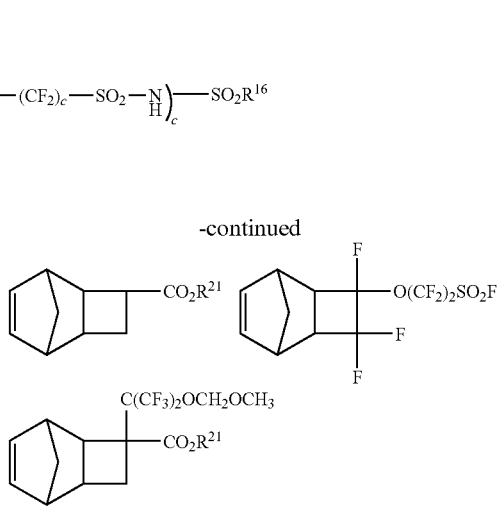

wherein $R^{21}$ is a group capable of forming or rearranging to a tertiary cation, more typically an alkyl group of 1 to 20 carbon atoms, and most typically t-butyl.

Compounds of structure (XII) wherein d=0, structure (XII-a), may be prepared by cycloaddition reaction of unsaturated compounds of structure (XIII) with quadricyclane (tetracyclo $[2.2.1.0^{2.6}0^{3.5}]$heptane) as shown in the equation below.

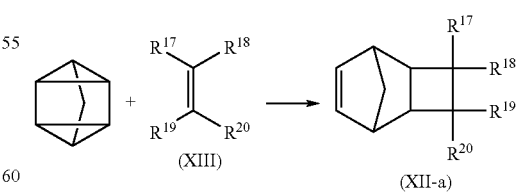

The reaction may be conducted at temperatures ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of structure (XII) with higher values of d (i.e., d=1 or 2) may be prepared by reaction of compounds of structure (XII) with d=0 with cyclopentadiene, as is known in the art.

In one embodiment, the fluorinated acid polymer also comprises a repeat unit derived from at least one ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated fluoroalkyl group of from 1 to about ten carbon atoms. In one embodiment, the comonomer is tetrafluoroethylene.

In one embodiment, the fluorinated acid polymer comprises a polymeric backbone having pendant groups comprising siloxane sulfonic acid. In one embodiment, the siloxane pendant groups have the formula below:

wherein:
a is from 1 to b;
b is from 1 to 3;
$R^{22}$ is a non-hydrolyzable group independently selected from the group consisting of alkyl, aryl, and arylalkyl;
$R^{23}$ is a bidentate alkylene radical, which may be substituted by one or more ether oxygen atoms, with the proviso that $R^{23}$ has at least two carbon atoms linearly disposed between Si and $R_f$; and
$R_f$ is a perfluoralkylene radical, which may be substituted by one or more ether oxygen atoms.

In one embodiment, the fluorinated acid polymer having pendant siloxane groups has a fluorinated backbone. In one embodiment, the backbone is perfluorinated.

In one embodiment, the fluorinated acid polymer has a fluorinated backbone and pendant groups represented by the Formula (XIV)

$$—O_g—[CF(R_f^2)CF—O_h]_i—CF_2CF_2SO_3H \quad (XIV)$$

wherein $R_f^2$ is F or a perfluoroalkyl radical having 1-10 carbon atoms either unsubstituted or substituted by one or more ether oxygen atoms, h=0 or 1, i=0 to 3, and g=0 or 1.

In one embodiment, the fluorinated acid polymer has formula (XV)

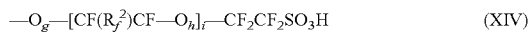

(XV)

where j≧0, k≧0 and 4≦(j+k)≦199, $Q^1$ and $Q^2$ are F or H, $R_f^2$ is F or a perfluoroalkyl radical having 1-10 carbon atoms either unsubstituted or substituted by one or more ether oxygen atoms, h=0 or 1, i=0 to 3, g=0 or 1. In one embodiment $R_f^2$ is —$CF_3$, g=1, h=1, and i=1. In one embodiment the pendant group is present at a concentration of 3-10 mol-%.

In one embodiment, $Q^1$ is H, k≧0, and $Q^2$ is F, which may be synthesized according to the teachings of Connolly et al., U.S. Pat. No. 3,282,875. In another preferred embodiment, $Q^1$ is H, $Q^2$ is H, g=0, $R_f^2$ is F, h=1, and l=1, which may be synthesized according to the teachings of co-pending application Ser. No. 60/105,662. Still other embodiments may be synthesized according to the various teachings in Drysdale et al., WO 9831716(A1), and co-pending US applications Choi et al, WO 99/52954 (A1), and 60/176,881.

In one embodiment, the fluorinated acid polymer is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000.

In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any colloid-forming polymeric material having acidic protons can be used. In one embodiment, the colloid-forming fluorinated polymeric acid has acidic groups selected from carboxylic groups, sulfonic acid groups, and sulfonimide groups. In one embodiment, the colloid-forming fluorinated polymeric acid is a polymeric sulfonic acid. In one embodiment, the colloid-forming polymeric sulfonic acid is perfluorinated. In one embodiment, the colloid-forming polymeric sulfonic acid is a perfluoroalkylenesulfonic acid.

In one embodiment, the colloid-forming polymeric acid is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula —$SO_3E^5$ where $E^5$ is a cation, also known as a "counterion". $E^5$ may be H, Li, Na, K or $N(R_1)(R_2)(R_3)(R_4)$, and $R_1$, $R_2$, $R_3$, and $R_4$ are the same or different and are and in one embodiment H, $CH_3$ or $C_2H_5$. In another embodiment, $E^5$ is H, in which case the polymer is said to be in the "acid form". $E^5$ may also be multivalent, as represented by such ions as $Ca^{++}$, and $Al^{+++}$. It is clear to the skilled artisan that in the case of multivalent counterions, represented generally as $M^{x+}$, the number of sulfonate functional groups per counterion will be equal to the valence "x".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—$SO_2F$), which can be subsequently hydrolyzed to a sulfonate functional group. For example, copolymers of a first fluorinated vinyl monomer together with a second fluorinated vinyl monomer having a sulfonyl fluoride group (—$SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, possible second monomers include fluorinated vinyl ethers with sulfonate functional groups or precursor groups which can provide the desired side chain in the polymer. Additional monomers, including ethylene, propylene, and R—CH=$CH_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the present compositions include a highly fluorinated, and in one embodiment perfluorinated, carbon backbone and side chains represented by the formula

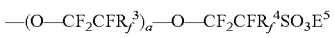

wherein $R_f^3$ and $R_f^4$ are independently selected from F, Cl or a perfluorinated alkyl group having 1 to 10 carbon atoms, a=0, 1 or 2, and $E^5$ is H, Li, Na, K or N(R1)(R2)(R3)(R4) and R1, R2, R3, and R4 are the same or different and are and in one embodiment H, $CH_3$ or $C_2H_5$. In another embodiment $E^5$ is H. As stated above, $E^5$ may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

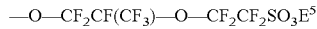

where X is as defined above. FSA polymers of this type are disclosed in U.S. Pat. No. 3,282,875 and can be made by copolymerization of tetrafluoroethylene (TFE) and the perfluorinated vinyl ether $CF_2=CF$—O—$CF_2CF(CF_3)$—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3E^5$, wherein $E^5$ is as defined above. This polymer can be made by copolymerization of tetrafluoroethylene (TFE) and the perfluorinated vinyl ether $CF_2=CF$—O—$CF_2CF_2SO_2F$, perfluoro(3-oxa-4-pentenesulfonyl fluoride) (POPF), followed by hydrolysis and further ion exchange as necessary.

In one embodiment, the FSA polymers for use in the present compositions typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—$CF_2$—$CF(CF_3)$—O—$CF_2$—$CF_2$—$SO_3H$ (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—$CF_2CF_2SO_3H$ (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

Aqueous dispersions of the colloid-forming polymeric acids, including FSA polymers, typically have particle sizes as small as possible and an EW as small as possible, so long as a stable colloid is formed.

Aqueous dispersions of FSA polymer are available commercially as Nafion® dispersions, from E. I. du Pont de Nemours and Company (Wilmington, Del.).

Some of the polymers described hereinabove may be formed in non-acid form, e.g., as salts, esters, or sulfonyl fluorides. They will be converted to the acid form for the preparation of conductive compositions, described below.

c. Preparation of Conductive Polymer Compositions with Fluorinated Acid Polymers The electrically conductive polymer composition is prepared by (i) polymerizing the precursor monomers in the presence of the fluorinated acid polymer; or (ii) first forming the intrinsically conductive copolymer and combining it with the fluorinated acid polymer.

(i) Polymerizing Precursor Monomers in the Presence of the Fluorinated Acid Polymer In one embodiment, the electrically conductive polymer composition is formed by the oxidative polymerization of the precursor monomers in the presence of the fluorinated acid polymer. In one embodiment, the precursor monomers comprises two or more conductive precursor monomers. In one embodiment, the monomers comprise an intermediate precursor monomer having the structure A-B-C, where A and C represent conductive precursor monomers, which can be the same or different, and B represents a non-conductive precursor monomer. In one embodiment, the intermediate precursor monomer is polymerized with one or more conductive precursor monomers.

In one embodiment, the oxidative polymerization is carried out in a homogeneous aqueous solution. In another embodiment, the oxidative polymerization is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the conductive polymer in association with the fluorinated acid polymer. In one embodiment, the intrinsically conductive polymer is positively charged, and the charges are balanced by the fluorinated acid polymer anion.

In one embodiment, the method of making an aqueous dispersion of the conductive polymer composition includes forming a reaction mixture by combining water, precursor monomer, at least one fluorinated acid polymer, and an oxidizing agent, in any order, provided that at least a portion of the fluorinated acid polymer is present when at least one of the precursor monomer and the oxidizing agent is added.

In one embodiment, the method of making the conductive polymer composition comprises:
  (a) providing an aqueous solution or dispersion of a fluorinated acid polymer;
  (b) adding an oxidizer to the solutions or dispersion of step (a); and
  (c) adding precursor monomer to the mixture of step (b).

In another embodiment, the precursor monomer is added to the aqueous solution or dispersion of the fluorinated acid polymer prior to adding the oxidizer. Step (b) above, which is adding oxidizing agent, is then carried out.

In another embodiment, a mixture of water and the precursor monomer is formed, in a concentration typically in the range of about 0.5% by weight to about 4.0% by weight total precursor monomer. This precursor monomer mixture is added to the aqueous solution or dispersion of the fluorinated acid polymer, and steps (b) above which is adding oxidizing agent is carried out.

In another embodiment, the aqueous polymerization mixture may include a polymerization catalyst, such as ferric sulfate, ferric chloride, and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, amides, and combinations thereof. In one embodiment, the co-dispersing liquid is an alcohol. In one embodiment, the co-dispersing liquid is an organic solvent selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is less than about 30% by volume. In one embodiment, the amount of co-dispersing liquid is between 5 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process.

In one embodiment, the polymerization is carried out in the presence of a co-acid which is a Brønsted acid. The acid can be an inorganic acid, such as HCl, sulfuric acid, and the like, or an organic acid, such as acetic acid or p-toluenesulfonic acid. Alternatively, the acid can be a water soluble polymeric acid such as poly(styrenesulfonic acid), poly(2-acrylamido-2-methyl-1-propanesulfonic acid, or the like, or a second fluorinated acid polymer, as described above. Combinations of acids can be used.

The co-acid can be added to the reaction mixture at any point in the process prior to the addition of either the oxidizer or the precursor monomer, whichever is added last. In one embodiment, the co-acid is added before both the precursor monomers and the fluorinated acid polymer, and the oxidizer is added last. In one embodiment the co-acid is added prior to the addition of the precursor monomers, followed by the addition of the fluorinated acid polymer, and the oxidizer is added last.

In one embodiment, the polymerization is carried out in the presence of both a co-dispersing liquid and a co-acid.

In one embodiment, a reaction vessel is charged first with a mixture of water, alcohol co-dispersing agent, and inorganic co-acid. To this is added, in order, the precursor monomers, an aqueous solution or dispersion of fluorinated acid polymer, and an oxidizer. The oxidizer is added slowly and dropwise to prevent the formation of localized areas of high ion concentration which can destabilize the mixture. The mixture is stirred and the reaction is then allowed to proceed at a controlled temperature. When polymerization is completed, the reaction mixture is treated with a strong acid cation resin, stirred and filtered; and then treated with a base anion exchange resin, stirred and filtered. Alternative orders of addition can be used, as discussed above.

In the method of making the conductive polymer composition, the molar ratio of oxidizer to total precursor monomer is generally in the range of 0.1 to 2.0; and in one embodiment is 0.4 to 1.5. The molar ratio of fluorinated acid polymer to total precursor monomer is generally in the range of 0.2 to 5. In one embodiment, the ratio is in the range of 1 to 4. The overall solid content is generally in the range of about 1.0% to 10% in weight percentage; and in one embodiment of about 2% to 4.5%. The reaction temperature is generally in the range of about 4° C. to 50° C.; in one embodiment about 20° C. to 35° C. The molar ratio of optional co-acid to precursor monomer is about 0.05 to 4. The addition time of the oxidizer influences particle size and viscosity. Thus, the particle size can be reduced by slowing down the addition speed. In parallel, the viscosity is increased by slowing down the addition speed. The reaction time is generally in the range of about 1 to about 30 hours.

(ii) Combining Intrinsically Conductive Polymers with Fluorinated Acid Polymers

In one embodiment, the intrinsically conductive polymers are formed separately from the fluorinated acid polymer. In one embodiment, the polymers are prepared by oxidatively polymerizing the corresponding monomers in aqueous solution. In one embodiment, the oxidative polymerization is carried out in the presence of a water soluble acid. In one embodiment, the acid is a water-soluble non-fluororinated polymeric acid. In one embodiment, the acid is a non-fluorinated polymeric sulfonic acid. Some non-limiting examples of the acids are poly(styrenesulfonic acid) ("PSSA"), poly(2-acrylamido-2-methyl-1-propanesulfonic acid) ("PAAMPSA"), and mixtures thereof. Where the oxidative polymerization results in a polymer that has positive charge, the acid anion provides the counterion for the conductive polymer. The oxidative polymerization is carried out using an oxidizing agent such as ammonium persulfate, sodium persulfate, and mixtures thereof.

The electrically conductive polymer composition is prepared by blending the intrinsically conductive polymer with the fluorinated acid polymer. This can be accomplished by adding an aqueous dispersion of the intrinsically conductive polymer to a dispersion or solution of the polymeric acid. In one embodiment, the composition is further treated using sonication or microfluidization to ensure mixing of the components.

In one embodiment, one or both of the intrinsically conductive polymer and fluorinated acid polymer are isolated in solid form. The solid material can be redispersed in water or in an aqueous solution or dispersion of the other component.

For example, intrinsically conductive polymer solids can be dispersed in an aqueous solution or dispersion of a fluorinated acid polymer.

(iii) pH Adjustment

As synthesized, the aqueous dispersions of the conductive polymer composition generally have a very low pH. In one embodiment, the pH is adjusted to higher values, without adversely affecting the properties in devices. In one embodiment, the pH of the dispersion is adjusted to about 1.5 to about 4. In one embodiment, the pH is adjusted to between 3 and 4. It has been found that the pH can be adjusted using known techniques, for example, ion exchange or by titration with an aqueous basic solution.

In one embodiment, after completion of the polymerization reaction, the as-synthesized aqueous dispersion is contacted with at least one ion exchange resin under conditions suitable to remove decomposed species, side reaction products, and unreacted monomers, and to adjust pH, thus producing a stable, aqueous dispersion with a desired pH. In one embodiment, the as-synthesized aqueous dispersion is contacted with a first ion exchange resin and a second ion exchange resin, in any order. The as-synthesized aqueous dispersion can be treated with both the first and second ion exchange resins simultaneously, or it can be treated sequentially with one and then the other.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions.

In one embodiment, the first ion exchange resin is a cation, acid exchange resin which can be in protonic or metal ion, typically sodium ion, form. The second ion exchange resin is a basic, anion exchange resin. Both acidic, cation including proton exchange resins and basic, anion exchange resins are contemplated for use in the practice of the processes herein. In one embodiment, the acidic, cation exchange resin is an inorganic acid, cation exchange resin, such as a sulfonic acid cation exchange resin. Sulfonic acid cation exchange resins contemplated for use in the practice of the processes herein include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the processes herein include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-synthesized aqueous dispersion either simultaneously, or consecutively. For example, in one embodiment both resins are added simultaneously to an as-synthesized aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins renders the acidic sites more basic, resulting in increased pH of the dispersion. In general, about one to five grams of ion exchange resin is used per gram of conductive polymer composition. In many cases, the basic ion exchange resin can be used to adjust the pH to the desired level. In some cases, the pH can be further adjusted with an aqueous basic solution such as a solution of sodium hydroxide, ammonium hydroxide, tetra-methylammonium hydroxide, or the like.

4. Hole Transport Layer

Any hole transport material may be used for the hole transport layer. In one embodiment the hole transport material has an optical band gap equal to or less than 4.2 eV and a HOMO level equal to or less than 6.2 eV with respect to vacuum level.

In one embodiment, the hole transport material comprises at least one polymer. Examples of hole transport polymers include those having hole transport groups. Such hole transport groups include, but are not limited to, carbazole, triarylamines, triarylmethane, fluorene, and combinations thereof.

In one embodiment, the hole transport material is an oligomeric or polymeric material which is crosslinkable. In some embodiments, the crosslinkable material can be applied to form the hole transport layer and then crosslinked to form a more robust layer. Crosslinkable groups are well known in the art. The crosslinking can be accomplished by exposure to any type of radiation, including UV and thermal radiation. In one embodiment, the hole transport material is a crosslinkable polymer of fluorene-triarylamine.

In one embodiment, the hole transport layer comprises a non-polymeric hole transport material. Examples of hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine.

In one embodiment, the hole transport layer comprises a material having the Formula XVI:

Formula XVI

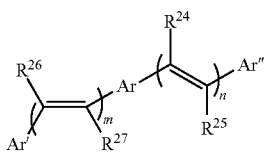

wherein
  Ar is an arylene group;
  Ar', and Ar" are selected independently from aryl groups;
  $R^{24}$ through $R^{27}$ are selected independently from the group consisting of hydrogen, alkyl, aryl, halogen, hydroxyl, aryloxy, alkoxy, alkenyl, alkyny, amino, alkylthio, phosphino, silyl, —COR, —COOR, —$PO_3R_2$, —$OPO_3R_2$, and CN;
  R is selected from the group consisting of hydrogen, alkyl, aryl, alkenyl, alkynyl, and amino; and
  m and n are integers each independently having a value of from 0 to 5, where m+n≠0.
In one embodiment of Formula XVI, Ar is an arylene group containing two or more ortho-fused benzene rings in a straight linear arrangement.

5. Electroluminescent Materials

Any electroluminescent ("EL") materials can be used, so long as they emit the desired colors. In some embodiments, the desired colors are selected from red, green and blue. Electroluminescent materials include small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In some embodiments, the EL material is present with a host material. In some embodiments, the host is a charge carrying material. In an EL/host system, the EL material can be a small molecule or polymer and the host can be independently a small molecule or polymer.

In some embodiments, the EL material is a cyclometalated complex of iridium. In some embodiments, the complex has two ligands selected from phenylpyridines, phenylquinolines, and phenylisoquinolines, and a third liqand with is a β-dienolate. The ligands may be unsubstituted or substituted with F, D, alkyl, CN, or aryl groups.

In some embodiments, the EL material is a polymer selected from the group consisting of poly(phenylenevinylenes), polyfluorenes, and polyspirobifluorenes.

In some embodiments, the EL material is selected from the group consisting of a non-polymeric spirobifluorene compound and a fluoranthene compound.

In some embodiments, the EL material is a compound having aryl amine groups. In one embodiment, the EL material is selected from the formulae below:

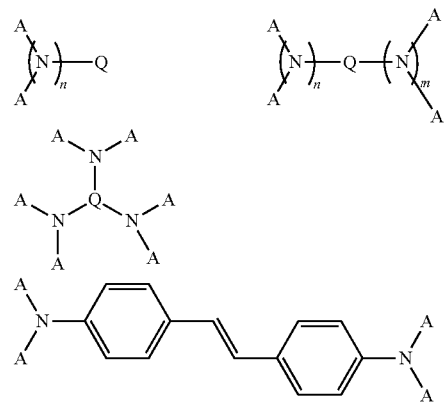

where:
  A is the same or different at each occurrence and is an aromatic group having from 3-60 carbon atoms;
  Q is a single bond or an aromatic group having from 3-60 carbon atoms;
  n and m are independently an integer from 1-6.

In one embodiment of the above formula, at least one of A and Q in each formula has at least three condensed rings. In one embodiment, m and n are equal to 1. In one embodiment, Q is a styryl or styrylphenyl group.

In one embodiment, the EL material has the formula below:

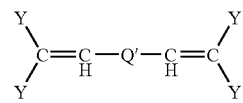

where:
  Y is the same or different at each occurrence and is an aromatic group having 3-60 carbon atoms;
  Q' is an aromatic group, a divalent triphenylamine residue group, or a single bond.

In one embodiment, the host is a bis-condensed cyclic aromatic compound

In one embodiment, the host is anthracene derivative compound. In one embodiment the compound has the formula:

An-L-An where:
  An is an anthracene moiety;
  L is a divalent connecting group.
In one embodiment of this formula, L is a single bond, —O—, —S—, —N(R)—, or an aromatic group. In one embodiment, An is a mono- or diphenylanthryl moiety.

In one embodiment, the host has the formula:

A-An-A where:
  An is an anthracene moiety;
  A is an aromatic group.

In one embodiment, the host has the formula:

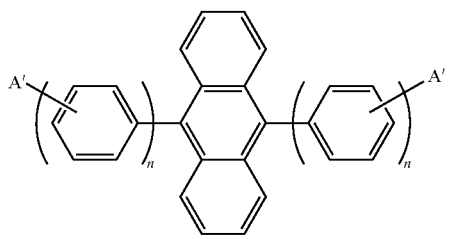

where:

A' is the same or different at each occurrence and is an aromatic group or an alkenyl group;

n is the same or different at each occurrence and is an integer from 1-3.

In one embodiment, the blue and green EL materials are small molecules. In one embodiment, the blue and green electroluminescent materials are applied with a host material. In one embodiment, the host material is a polymer. Examples of polymeric host materials include poly(phenylenevinylenes), polyfluorenes, poly(spirobifluorenes). In one embodiment, the host material is a small molecule. As used herein, the term "small molecule" refers to a material that does not have repeating monomer units and has a molecular weight less than 5000.

Some specific examples of small molecule blue EL materials are:

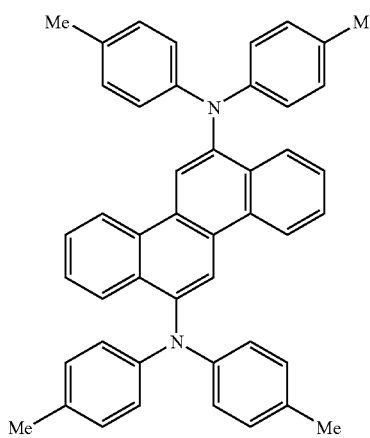

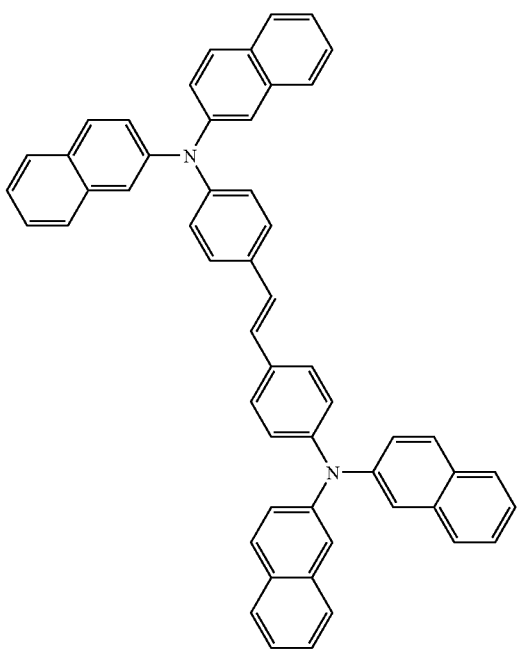

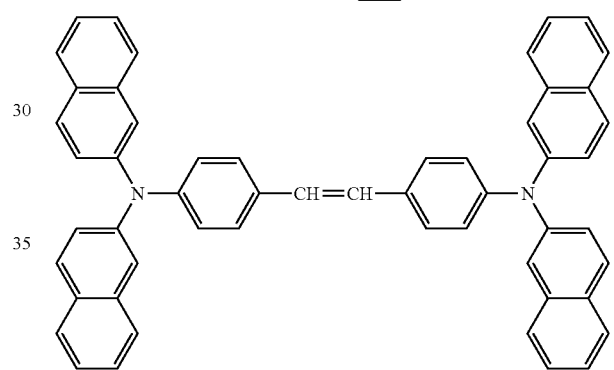

One example of a small molecule green EL material is:

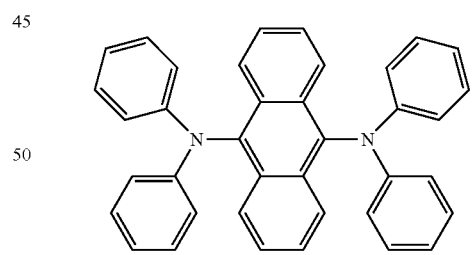

This green El compound may also have one or more methyl substituents.

Some examples of small molecule host materials are:

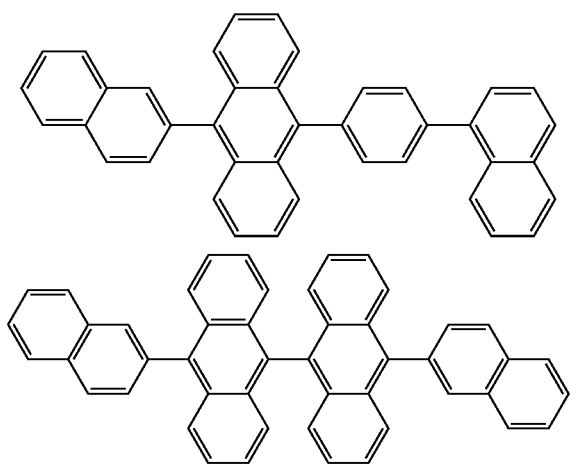

In some embodiments, the red EL material is a polymer. Examples of polymeric red EL materials include substituted polyfluorenes and poly(phenylenevinylenes).

In some embodiments, the red EL material is a small molecule material. One example of a red small molecule material is:

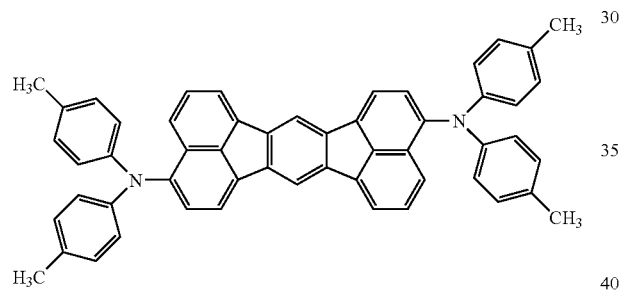

In some embodiments, the red EL material is an organometallic complex. In some embodiments, the red EL material is a cyclometalated iridium complex. In some embodiments, the complex has two cyclometalating ligands selected from the group consisting of phenylpyridines, phenylquinolines, phenylisoquinolines, thienylpyridines, thienylquinolines, thienylisoquinolines, and combinations thereof. The ligands may be substituted. In one embodiment, the substituent groups are selected from D, F, CN, alkyl groups, alkoxyl groups, trialkylsilyl groups, triarylsilyl groups, and aryl groups.

In one embodiment, the red EL material has one of the formulae below:

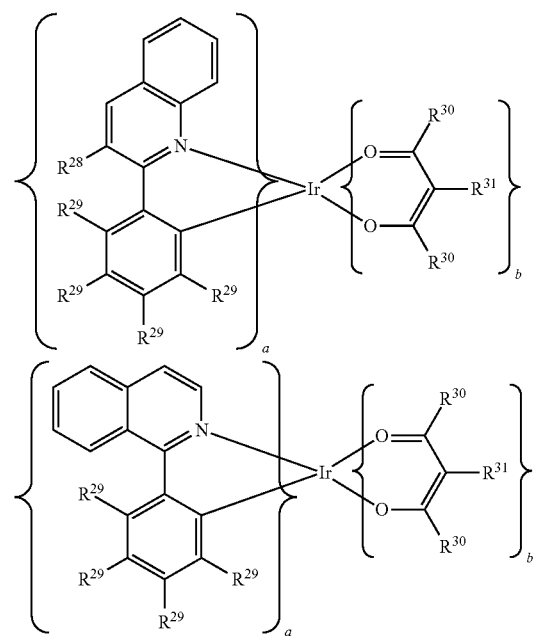

wherein:

a is 1, 2, or 3;

b is 0, 1, or 2;

the sum of a+b is 3;

$R^{28}$ is H, F, or alkyl;

$R^{29}$ is the same or different at each occurrence and is selected from the group consisting of H, D, F, alkyl, alkoxyl, trialkylsilyl, triarylsily, and aryl;

$R^{30}$ is the same or different at each occurrence and is alkyl or aryl; and $R^{31}$ is H or alkyl.

In one embodiment, at least one of $R^{28}$ and $R^{29}$ is not H. In one embodiment a is 2 and b is 1.

Some specific examples of red emitters are:

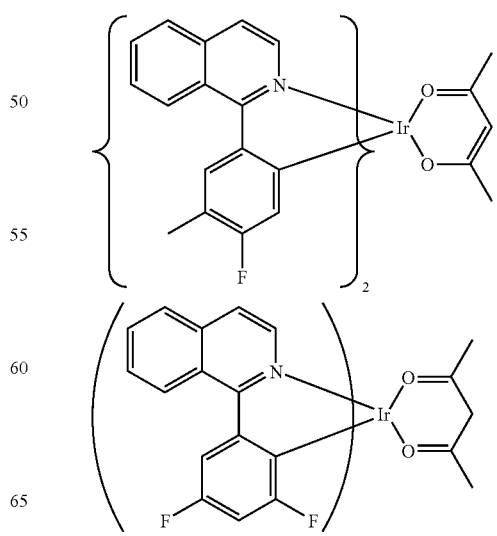

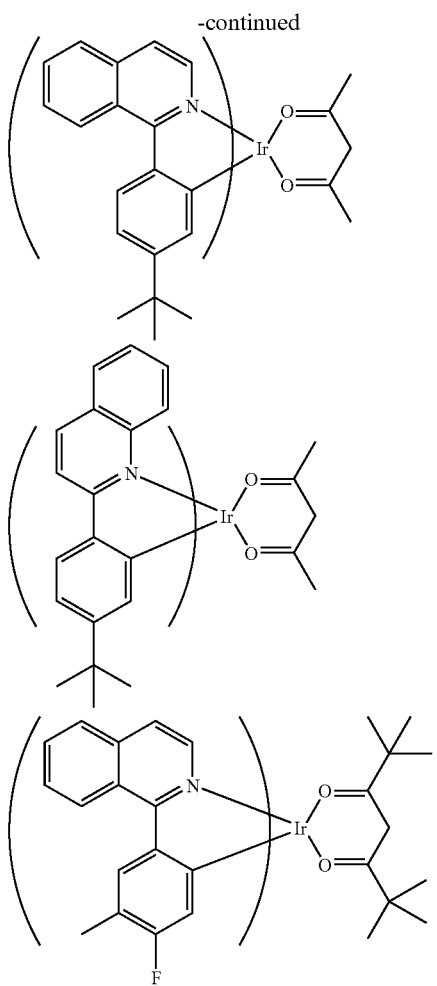

6. Other Layers

The other layers of the device can be made of any materials which are known to be useful in such layers. The device may include a support or substrate (not shown) that can be adjacent to the anode layer 210 or the cathode layer 260. Most frequently, the support is adjacent the anode layer 210. The support can be flexible or rigid, organic or inorganic. Generally, glass or flexible organic films are used as a support. The anode layer 210 is an electrode that is more efficient for injecting holes compared to the cathode layer 160. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 210 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 210 include, but are not limited to, indium-tin-oxide ("ITO"), aluminum-tin-oxide, gold, silver, copper, and nickel. The anode may also comprise an organic material such as polyaniline, polythiophene, or polypyrrole.

The anode layer 210 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 210 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 210 typically is formed into substantially parallel strips having lengths that extend in substantially the same direction.

In one embodiment, a primer layer (not shown) is present between the hole injection layer 220 and the hole transport layer 230, or between the hole transport layer 230 and the EL layer 240. A primer layer facilitates the solution deposition of the next layer. In one embodiment, the primer layer facilitates deposition over the hole injection layer. The primer layer has a surface energy that is greater than the surface energy of the hole injection layer. The primer layer allows the transport of holes from the hole injection layer into the EL layer and does not significantly degrade the performance of the final device.

In one embodiment, the primer layer is a very thin layer comprising insulative material. In one embodiment, the layer has a thickness of 50 Å or less. In one embodiment, the layer has a thickness of 10 Å or less. In one embodiment, the insulative primer layer comprises a polymer. In one embodiment, the insulative primer layer comprises a small molecule material. In one embodiment, the insulative primer layer comprises a material having reactive groups which can be crosslinked after the formation of the layer to decrease solubility in solvents used in the formation of successive layers. Examples of insulative primer materials include vinyl and (meth)acrylate polymers and oligomers.

In one embodiment, the primer layer comprises a hole transport material. Examples of hole transport material have been discussed above.

Optional layer 250 can function both to facilitate electron injection/transport, and can also serve as a confinement layer to prevent quenching reactions at layer interfaces. More specifically, layer 250 may promote electron mobility and reduce the likelihood of a quenching reaction if layers 240 and 260 would otherwise be in direct contact. Examples of materials for optional layer 250 include, but are not limited to, metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 250 may be inorganic and comprise BaO, LiF, Li$_2$O, or the like.

The cathode 260, is an electrode that is particularly efficient for injecting electrons or negative charge carriers. The cathode layer 260 can be any metal or nonmetal having a lower work function than the first electrical contact layer (in this case, the anode layer 210). In one embodiment, the term "lower work function" is intended to mean a material having a work function no greater than about 4.4 eV. In one embodiment, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 260 include, but are not limited to, barium, lithium, cerium, cesium, europium, rubidium, yttrium, magnesium, samarium, and alloys and combinations thereof.

The cathode layer 260 is usually formed by a chemical or physical vapor deposition process.

In other embodiments, additional layer(s) may be present within organic electronic devices.

The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 210, 500-5000 Å, in one embodiment 1000-2000 Å; the hole injection layer 220, 50-2000 Å, in one embodiment 200-1000 Å; the hole transport layer 230, 50-2000 Å, in one embodiment 200-1000 Å; electroluminescent layer 240, 10-2000 Å, in one embodiment 100-1000 Å; optional electron transport layer 250, 50-2000 Å, in one embodiment 100-1000 Å; cathode 260, 200-10000 Å, in one embodiment 300-5000 Å.

In operation, a voltage from an appropriate power supply (not depicted) is applied to the device 200. Current therefore passes across the layers of the device 200. Electrons enter the organic polymer layer, releasing photons. In some OLEDs, called active matrix OLED displays, individual deposits of electroluminescent organic films may be independently excited by the passage of current, leading to individual pixels of light emission. In some OLEDs, called passive matrix OLED displays, deposits of electroluminescent organic films may be excited by rows and columns of electrical contact layers.

When a voltage is applied to the new OLED described herein, the red subpixels emit red light, the green subpixels emit green light, and the blue subpixels emit blue light.

7. Process

The new process described herein is for forming a multicolor organic light-emitting diode having at least first and second subpixel areas. The process has the steps:

applying a hole injection layer over an anode layer, said hole injection layer comprising a conductive polymer and a fluorinated acid polymer;

applying a hole transport layer over the hole injection layer;

applying a first electroluminescent material to the first subpixel areas;

applying a red electroluminescent material overall;

applying a cathode;

wherein the first electroluminescent material is selected from a green electroluminescent material and a blue electroluminescent material.

The anode is generally present on a substrate, as discussed above. The term "substrate" is intended to mean a base material that can be either rigid or flexible and may be include one or more layers of one or more materials, which can include, but are not limited to, glass, polymer, metal or ceramic materials or combinations thereof.

In some embodiments, particularly when the EL materials are applied by a liquid deposition technique, the substrate also contains a liquid containment structure. Containment structures are geometric obstacles to spreading: pixel wells, banks, etc. In order to be effective these structures must be large, comparable to the wet thickness of the deposited materials. In some embodiments, the structure is inadequate for complete containment, but still allows adjustment of thickness uniformity of the printed layer.

In one embodiment, the first layer is applied over a so-called bank structure. Bank structures are typically formed from photoresists, organic materials (e.g., polyimides), or inorganic materials (oxides, nitrides, and the like). Bank structures may be used for containing the first layer in its liquid form, preventing color mixing; and/or for improving the thickness uniformity of the first layer as it is dried from its liquid form; and/or for protecting underlying features from contact by the liquid. Such underlying features can include conductive traces, gaps between conductive traces, thin film transistors, electrodes, and the like.

In one embodiment, the hole injection layer is formed by liquid deposition of an aqueous dispersion of the hole injection material onto a substrate with an anode. In one embodiment the liquid deposition is continuous. Continuous deposition techniques, include but are not limited to, spin coating, gravure coating, curtain coating, dip coating, slot-die coating, spray coating, and continuous nozzle coating. In one embodiment, the liquid deposition is discontinuous. Discontinuous deposition techniques include, but are not limited to, ink jet printing, gravure printing, and screen printing. In one embodiment, the hole injection layer is formed overall and is not patterned.

In one embodiment, the hole transport layer is formed by liquid deposition of the hole transport material in a liquid medium. The liquid medium can be aqueous, semi-aqueous or non-aqueous. In one embodiment, the liquid medium is non-aqueous. In one embodiment, the hole transport layer is formed by a vapor deposition process. In one embodiment, the hole transport layer is formed overall and is not patterned.

In some embodiments, the process further comprises forming a liquid containment pattern of wettable and non-wettable areas, prior to deposition of the EL materials. The term "liquid containment" is intended to mean a structure or pattern within or on a workpiece, wherein such one or more structures or patterns, by themselves or collectively, serve a principal function of constraining or guiding a liquid within an area or region as it flows over the workpiece. The liquid containment pattern is used to contain the EL materials that are deposited from a liquid medium.

In one embodiment, the liquid containment pattern is formed by applying a low-surface-energy material ("LSE") over the hole transport layer in a pattern. The term "low-surface-energy material" is intended to mean a material which forms a layer with a low surface energy. The term "surface energy" is the energy required to create a unit area of a surface from a material. A characteristic of surface energy is that liquid materials with a given surface energy will not wet surfaces with a lower surface energy. The LSE forms a layer having a surface energy lower than that of the hole transport layer. In one embodiment, the LSE is a fluorinated material. The LSE can be applied by vapor deposition or thermal transfer. The LSE can be applied by a discontinuous liquid deposition technique from a liquid medium. When EL materials are deposited from a liquid medium having a surface energy higher than that of the LSE layer, the liquid medium will wet the areas not covered by the LSE and deposit the EL material in those areas.

In one embodiment, the liquid containment pattern is formed by depositing a blanket layer of an LSE. The LSE is then removed in a pattern. This can be accomplished, for example, using photoresist techniques or by laser ablation. In one embodiment, the LSE is thermally fugitive and is removed by treatment with an IR laser. When EL materials are deposited from a liquid medium having a surface energy higher than that of the LSE layer, the liquid medium will wet the areas not covered by the LSE and deposit the EL material in those areas.

In one embodiment, the liquid containment pattern is formed by applying a reactive surface-active composition ("RSA") to the hole transport layer. The RSA is a radiation-sensitive composition having a low surface energy. In one embodiment, the RSA is a fluorinated material. When exposed to radiation, at least one physical property and/or chemical property of the RSA is changed such that the exposed and unexposed areas can be physically differentiated. Treatment with the RSA lowers the surface energy of the material being treated. After the RSA is applied to the hole transport layer, it is exposed to radiation in a pattern, and developed to remove either the exposed or unexposed areas. Examples of development techniques include, but are not limited to, treatment with a liquid medium, treatment with an absorbant material, treatment with a tacky material, and the like. When EL materials are deposited from a liquid medium having a surface energy higher than that of the RSA layer, the liquid medium will wet the areas not covered by the RSA and deposit the EL material in those areas.

In one embodiment, the liquid containment pattern is formed by removing selected areas of the hole transport layer, leaving areas of the hole injection layer uncovered. This can be accomplished, for example, using photoresist techniques or by laser ablation. When EL materials are deposited from a liquid medium having a surface energy higher than that of the hole injection layer, the liquid medium will wet the areas of the hole transport layer which remain, and deposit the EL material in those areas.

After formation of the hole transport layer and, optionally, formation of the liquid containment pattern, a first EL layer is formed in the first subpixel area. The first EL layer comprises a first EL material, which can be a green EL material or a blue EL material. In one embodiment, the first EL material is applied by vapor deposition. A mask can be used so that the material is deposited only in the first subpixel areas. In one embodiment, a liquid containment pattern is present and the first EL material is applied by liquid deposition from a liquid composition. The liquid deposition process is carried out so that the first EL material is deposited in only the first EL subpixel areas. In one embodiment, the liquid composition further comprises a host material.

Optionally a second EL layer is then formed. The second EL layer comprises a second EL material. The second EL material can be a green EL material or a blue EL material, so long as it is different from the first EL material. Thus, for example, if the first EL material is a green EL material, the second EL material will be a blue EL material. In one embodiment, the second EL material is applied by vapor deposition. In one embodiment, a liquid containment pattern is present and the second EL material is applied by liquid deposition from a liquid composition. The liquid deposition process is carried out so that the second EL material is deposited in only the second EL subpixel areas. In one embodiment, the liquid composition further comprises a host material.

After the deposition of the first El layer and, optionally the second EL layer, the red EL material is applied overall. By "overall" is meant that substantially all of the active area of the device is covered. In one embodiment, all but the outer edges of the display are covered with the red EL material. Thus, the EL material is deposited in the third subpixel areas and over the first and second (when present) EL materials in the first and second (when present) subpixel areas. In one embodiment, the red EL material is applied by a continuous liquid deposition technique from a liquid composition. In this case, the liquid composition from which the red EL material is deposited should be one in which the previously deposited blue EL material is substantially not soluble. It is desirable to have substantially no mixing of the red EL material with any other EL material having an emission maximum of higher energy. In one embodiment, the liquid composition further comprises a host material. In one embodiment, the red EL material is applied by a vapor deposition technique.

After the application of the red EL material, the cathode is deposited, as described above. In some embodiments, an electron transport, and/or electron injection layer are deposited prior to the formation of the cathode. In some embodiments, the device is encapsulated to prevent exposure to oxygen and moisture.

When a voltage is applied to the OLED described herein, the third subpixels emit red light, while the subpixels having green EL material emit green light and the subpixels having blue EL material emit blue light. It is surprising that the subpixels having blue EL material emit blue light even though they are in contact with lower energy red EL material.

In one embodiment of the new process, the first EL layer is formed by deposition from a liquid composition and the red EL layer is formed by a vapor deposition process. In one embodiment, the first EL layer is formed by ink jet printing or continuous nozzle printing of a small molecule EL material and a host material in a liquid composition. The red EL layer is formed by thermal evaporation of a red-emitting small molecule EL material.

In one embodiment of the new process, the anode comprises indium tin oxide and is patterned on a glass substrate. The hole injection layer is formed by a continuous liquid deposition technique from an aqueous dispersion of a conductive polymer doped with a colloid-forming fluorinated polymeric sulfonic acid. The hole transport layer is deposited from a non-aqueous solution of a cross-linkable hole transport polymer. After deposition of the layer, it is heated to effect cross-linking. A liquid containment pattern is formed by applying an RSA, imaging with UV light, and washing out the unexposed areas. A green EL small molecule material is then deposited in first subpixel areas from a liquid composition which further comprises a host material. A blue EL small molecule material is then deposited in second subpixel areas from a liquid composition which further comprises a host material. A red cyclometalated iridium complex is then vapor deposited overall. A small molecule electron transport material is then vapor deposited overall. A small molecule electron injection layer is then vapor deposited. And, finally, the cathode is deposited.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

What is claimed is:

1. A process for forming a multicolor organic light-emitting diode having first and second subpixel areas, said process comprising:
    applying a hole injection layer over an anode layer, said hole injection
    layer comprising a conductive polymer and a fluorinated acid polymer; applying a hole transport layer over the hole injection layer;
    applying a first electroluminescent material only to the first subpixel areas;
    applying a red electroluminescent material over said first and second subpixel areas;
    applying a cathode;
    wherein the first electroluminescent material is selected from a green electroluminescent material and a blue electroluminescent material.

2. The process of claim 1, wherein the first electroluminescent material is applied by liquid deposition from a first liquid composition and the red electroluminescent material is applied by vapor deposition.

3. The process of claim 1, wherein the conductive polymer is selected from the group consisting of polythiophenes, polyselenophenes, poly(tellurophenes), polypyrroles, polyanilines, and polycyclic aromatics, and copolymers thereof.

4. The process of claim 1, wherein the first electroluminescent material and/or the red electroluminescent material is present with a host material.

5. The process of claim 1, wherein the fluorinated acid polymer has one or more backbones selected from the group consisting of polyolefins, polyacrylates, polymethacrylates, polyimides, polyamides, polyaramids, polyacrylamides, polystyrenes, and combinations thereof.

6. A process for forming a multicolor organic light-emitting diode having first, second and third subpixel areas, said process comprising:
    applying a hole injection layer over an anode layer, said hole injection layer comprising a conductive polymer and a fluorinated acid polymer;
    applying a hole transport layer over the hole injection layer;
    applying a first electroluminescent material only to the first subpixel areas;
    applying a second electroluminescent material only to the second subpixel areas;
    applying a red electroluminescent material over said first, second, and third subpixel areas;
    applying a cathode;
    wherein the first and second electroluminescent materials are selected from the group consisting of green electroluminescent materials and blue electroluminescent materials;
    with the proviso that the second electroluminescent material emits a color different from that of the first electroluminescent material.

7. The process of claim 6, wherein the first electroluminescent material is applied by liquid deposition from a first liquid composition, the second electroluminescent material is applied by liquid deposition from a second liquid composition, and the red electroluminescent material is applied by vapor deposition.

8. A multicolor organic light-emitting diode device having first and second subpixel areas, said device comprising:
    an anode;
    a hole injection layer comprising a conductive polymer and a fluorinated acid polymer;
    a hole transport layer;
    a first electroluminescent layer only in the first subpixel areas;
    a red electroluminescent layer over said first and second subpixel areas; and
    a cathode;
    wherein the first electroluminescent comprises a material selected from the group consisting of green electroluminescent materials and blue electroluminescent materials.

9. A multicolor organic light-emitting diode, device having first, second, and third subpixel areas, said device comprising:
    an anode;
    a hole injection layer comprising a conductive polymer and a fluorinated acid polymer;
    a hole transport layer;
    a first electroluminescent layer only in the first subpixel areas;
    a second electroluminescent layer only in the second subpixel areas;
    a red electroluminescent layer over said first, second, and third subpixel areas; and
    a cathode;
    wherein the first and second electroluminescent are different and each comprises a material selected from the group consisting of green electroluminescent materials and blue electroluminescent materials.

10. The process of claim 1, wherein the red electroluminescent material is applied by blanket deposition.

11. The process of claim 6, wherein the red electroluminescent material is applied by blanket deposition.

12. The process of claim 1, wherein the red electroluminescent material is applied by a continuous liquid deposition technique from a liquid composition.

13. The process of claim 6, wherein the red electroluminescent material is applied by a continuous liquid deposition technique from a liquid composition.

14. The process of claim 8, wherein the red electroluminescent layer is applied by a continuous liquid deposition technique from a liquid composition.

15. The process of claim 9, wherein the red electroluminescent layer is applied by a continuous liquid deposition technique from a liquid composition.

* * * * *